(12) United States Patent
Pon et al.

(10) Patent No.: US 9,646,952 B2
(45) Date of Patent: May 9, 2017

(54) MICROELECTRONIC PACKAGE DEBUG ACCESS PORTS

(71) Applicant: INTEL CORPORATION, Santa Clara, CA (US)

(72) Inventors: Florence R. Pon, Folsom, CA (US); Bilal Khalaf, Folsom, CA (US); Saeed S. Shojaie, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/857,317

(22) Filed: Sep. 17, 2015

(65) Prior Publication Data

US 2017/0084573 A1    Mar. 23, 2017

(51) Int. Cl.
*H01L 23/48* (2006.01)
*H01L 25/065* (2006.01)
*H01L 23/31* (2006.01)
*H01L 21/56* (2006.01)

(52) U.S. Cl.
CPC .......... *H01L 25/0652* (2013.01); *H01L 21/56* (2013.01); *H01L 23/3107* (2013.01)

(58) Field of Classification Search
CPC . H01L 23/48; H01L 25/0652; H01L 23/3107; G06F 17/50; G06F 11/25; G01R 21/3177; H03K 19/173
USPC ............... 257/737, 738, 778, 668, 773, 774
See application file for complete search history.

(56) References Cited

U.S. PATENT DOCUMENTS

| | | | |
|---|---|---|---|
| 9,106,229 B1 * | 8/2015 | Hutton | H03K 19/173 |
| 2005/0060673 A1 | 3/2005 | Mahanpour | |
| 2007/0272873 A1 * | 11/2007 | Jadrich | G01T 1/20 250/370.11 |
| 2008/0303173 A1 * | 12/2008 | Hamada | G01R 31/318544 257/777 |
| 2010/0230825 A1 * | 9/2010 | von Kaenel | H01L 23/49838 257/777 |
| 2012/0182066 A1 * | 7/2012 | Merkle | H05K 1/0243 327/564 |
| 2013/0139015 A1 * | 5/2013 | Vaccaro | G01R 31/318558 714/727 |
| 2013/0148401 A1 * | 6/2013 | Fai | G11O 5/063 365/63 |

(Continued)

FOREIGN PATENT DOCUMENTS

JP    11-94903 A    4/1999

OTHER PUBLICATIONS

International Search Report and Written Opinion received for PCT Application No. PCT/US2016/046952, mailed on Jan. 26, 2017, 9 pages.

*Primary Examiner* — Alexander Oscar Williams
(74) *Attorney, Agent, or Firm* — Winkle, PLLC

(57) ABSTRACT

A microelectronic package may be fabricated with debug access ports formed either at a side or at a bottom of the microelectronic package. In one embodiment, the debug access ports may be formed within an encapsulation material proximate the microelectronic package side. In another embodiment, the debug access ports may be formed in a microelectronic interposer of the microelectronic package proximate the microelectronic package side. In a further embodiment, the debug access ports may be formed at the microelectronic package bottom and may include a solder contact.

16 Claims, 4 Drawing Sheets

(56) References Cited

U.S. PATENT DOCUMENTS

| | | | |
|---|---|---|---|
| 2013/0346816 A1* | 12/2013 | Menon | G01R 31/318572 |
| | | | 714/727 |
| 2014/0091473 A1 | 4/2014 | Len et al. | |
| 2014/0203278 A1* | 7/2014 | Ossimitz | H01L 22/32 |
| | | | 257/48 |
| 2014/0306355 A1 | 10/2014 | Meyer et al. | |
| 2016/0011260 A1* | 1/2016 | Dervisoglu | G01R 31/3177 |
| | | | 714/727 |

* cited by examiner

MICROELECTRONIC PACKAGE DEBUG ACCESS PORTS

TECHNICAL FIELD

Embodiments of the present description generally relate to the field of fabricating microelectronic packages, and, more particularly, to debug access ports formed in or on the microelectronic package.

BACKGROUND

The microelectronic industry is continually striving to produce ever faster and smaller microelectronic packages for use in various electronic products, including, but not limited to, computer server products and portable products, such as portable computers, electronic tablets, cellular phones, digital cameras, and the like. One way to achieve these goals is to fabricate System-In-Package (SIP) microelectronic packages wherein an entire electronic system is formed in a single microelectronic package, which may include processors, application specific integrated circuit (ASIC) devices, volatile memory, non-volatile memory, power systems, wireless communication devices, and the like. Such SIP microelectronic packages are generally attached to a microelectronic substrate, such as a motherboard, with interconnects, such as solder balls, in a flip-chip configuration. As the microelectronic devices within the microelectronic package are fully encapsulated, there is no way to access internal circuitry within the microelectronic devices for debugging purposes except through the interconnects. However, once the microelectronic package is attached to the motherboard, the interconnects are no longer accessible for debugging purposes. One option for debugging would be to fabricate probe points on the microelectronic substrate, such as a motherboard. This would be undesirable for various reasons, including taking up valuable space on the microelectronic substrate, thereby hampering the drive to reduce the size of electronic products. Another option for debugging would be to remove or desolder the microelectronic package from the motherboard and test the failed microelectronic package on a dedicated debug board. However, three issues arise with desoldering. First, initial debug requires the preservation of the electrical state of the microelectronic package, which will be lost through desoldering and, thus, valuable data is lost. Second, the microelectronic packages have a limited number attachment, desoldering, and reworking processes that they can go through before becoming non-functional, as will be understood to those skilled in the art. Third, debugging sometimes needs to be done in the field at a customer's site where desoldering is not possible. Therefore, it is important to develop ways to debug a microelectronic package without requiring probe points on the microelectronic substrate and without requiring the removal of the microelectronic package from the microelectronic substrate.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
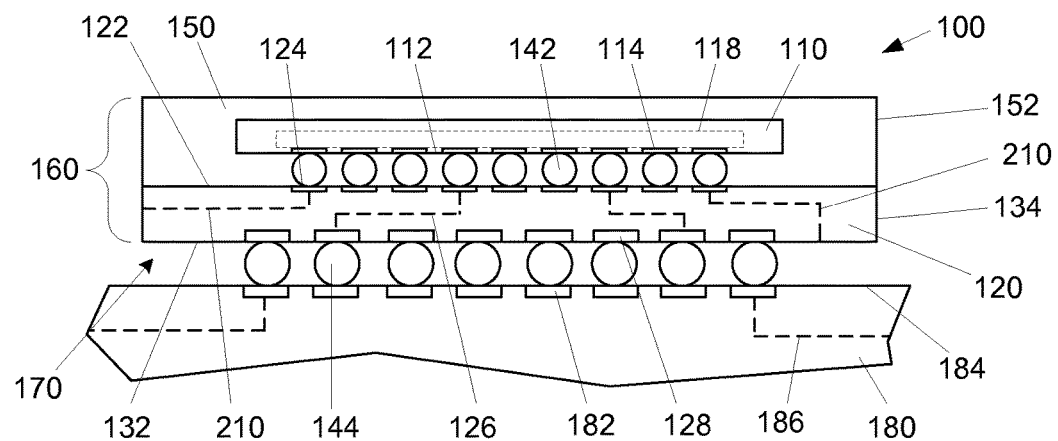
FIG. 1 illustrates a cross-sectional view of a microelectronic package, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Embodiments of the present description include a microelectronic package fabricated with debug access ports formed either at a side or at a bottom of the microelectronic package. In one embodiment, the debug access ports may be formed within an encapsulation material proximate the microelectronic package side. In another embodiment, the debug access ports may be formed in a microelectronic interposer of the microelectronic package proximate the microelectronic package side. In a further embodiment, the debug access ports may be formed at the microelectronic package bottom and may include a solder contact.

In the production of microelectronic packages, microelectronic devices are generally mounted on microelectronic substrates, such as interposers, which provide electrical communication routes between the microelectronic devices within the microelectronic package and/or with external components. These microelectronic packages are, in turn, attached to a microelectronic substrate, such as a motherboard.

As shown in FIG. 1, a microelectronic package 100 may comprise at least one microelectronic device 110, such as a microprocessor, a chipset, a graphics device, a wireless device, a memory device, an application specific integrated circuit, combinations thereof, or the like, attached to a first surface 122 of a microelectronic interposer 120 through a plurality of solder interconnects 142 in a configuration generally known as a flip-chip or controlled collapse chip connection ("C4") configuration. The device-to-interposer solder interconnects 142 may extend from interconnection pads 114 on an active surface 112 of the microelectronic device 110 and interconnection pads 124 on the microelectronic interposer first surface 122. The microelectronic device interconnection pads 114 may be in electrical communication with integrated circuitry 118 (shown generically as a dashed box) within the microelectronic device 110. The microelectronic interposer 120 may include at least one conductive trace 126 extending therethrough forming conductive path from the microelectronic device 110 to at least one microelectronic package interconnection pad 128 on or proximate a second surface 132 of the microelectronic interposer 120. The microelectronic interposer 120 may reroute a fine pitch (center-to-center distance between the microelectronic device interconnection pads 114) of the microelectronic device interconnection pads 114 to a relatively wider pitch of the microelectronic package interconnection pads 128.

It is understood that although FIG. 1 illustrates the microelectronic device 110 being connected to the microelectronic interposer 120 with the device-to-interposer solder interconnects 142 with a flip-chip technique, the embodiments of the present description are not so limited, as the microelectronic device 110 may also to be connected to the microelectronic interposer 120 by any known electrical structure, including, but not limited to, lead frames, bond wires, and the like.

As further shown in FIG. 1, the microelectronic device 110 may be encapsulated with an encapsulation material 150, such as an epoxy. The encapsulation material 150 may also encapsulate the microelectronic interposer first surface 122 and extended to at least one side 134 of the microelectronic interposer 120 to form an encapsulation material side 152 that may be substantially planar to the microelectronic interposer side 134. The microelectronic interposer side 134 and the encapsulation material side 152 comprise a side 160 of the microelectronic package 100. The microelectronic interposer second surface 132 may be proximate an attachment surface 170 of the microelectronic package 100.

As shown in FIG. 1, the microelectronic interposer conductive traces 126 may include at least one debug trace 210, wherein the debug trace 210 may form a conductive route from the microelectronic device 110 to the microelectronic package side 160 (shown on the left hand side of the figure) and/or the debug trace 210 may form a conductive route from the microelectronic device 110 to the microelectronic package attachment surface 170 (shown on the right hand side of the figure).

The microelectronic package 100 may be attached to a microelectronic substrate 180, such as printed circuit board, a motherboard, and the like, through a plurality of solder interconnects 144. The package-to-substrate solder interconnects 144 may extend between the microelectronic package interconnection pads 128 and substantially mirror-image interconnection pads 182 on an attachment surface 184 of the microelectronic substrate 180. The microelectronic substrate interconnection pads 182 may be in electrical communication with conductive routes (shown as dashed lines 186) within the microelectronic substrate 180. The microelectronic substrate conductive routes 186 may provide electrical communication routes to external components (not shown).

Both the microelectronic interposer 120 and the microelectronic substrate 180 may be primarily composed of any appropriate material, including, but not limited to, bismaleimine triazine resin, fire retardant grade 4 material, polyimide materials, liquid crystal polymer, polybenzoxazole, epoxy resin, silica-filled epoxy, glass reinforced epoxy matrix material, and the like, as well as laminates or multiple layers thereof. The microelectronic interposer conductive traces 126, including the debug traces 210, and the microelectronic substrate conductive routes 186 may be composed of any conductive material, including but not limited to metals, such as copper, aluminum, gold, silver, nickel, alloys thereof, and the like. The fabrication processes for the microelectronic interposer 120 and the microelectronic substrate 180 are well known in the art and for the sake of brevity and conciseness will not be precisely discussed or further illustrated herein.

The device-to-interposer solder interconnects 142 and the package-to-substrate solder interconnects 144 can be made of any appropriate solder material, including, but not limited to, lead/tin alloys, such as 63% tin/37% lead solder, and high tin content alloys (e.g. 90% or more tin), such as tin/bismuth, eutectic tin/silver, ternary tin/silver/copper, eutectic tin/copper, and similar alloys. The solder may be reflowed, either by heat, pressure, and/or sonic energy to secure the solder between the respective interconnections pads, as will be understood to those skilled in the art.

Figure 2:
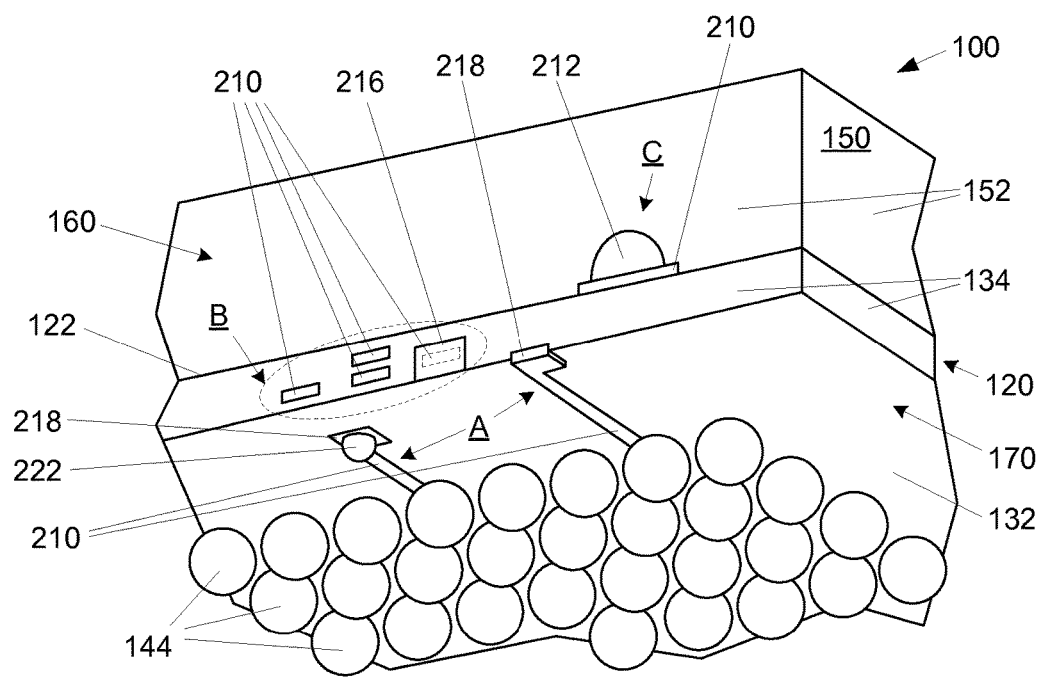
FIG. 2 illustrates an oblique view of a microelectronic package having debug access ports, according to embodiments of the present description.

FIG. 2 illustrates various configurations of debug access ports grouped as type A, B, and C. In one embodiments, a debug access port A may comprise the debug trace 210 formed on or in microelectronic interposer second surface 132. The debug trace 210 may include a contact pad 218, which may be larger than the debug trace 210 to have an appropriate dimension to contact a debug probe (not shown), as will be understood to those skilled in the art. In a further embodiment, a solder bump 222 may be formed on the debug trace 210, such as on the contact pad 218 of the debug trace 210, as shown. As will be understood to those skilled in the art, the solder bump 222 can be latched on with a specifically designed external debug probe (not shown).

In another embodiments shown in FIG. 2, a debug access port B may comprise the debug trace 210 formed within microelectronic interposer 120. The debug trace 210 may simply terminate at the microelectronic interposer side 134, wherein the debug trace 210 may be contacted by an external debug probe (not shown). In a further embodiment, as previous discussed, the microelectronic interposer 120 may be formed in layers; thus, there may be a plurality of debug traces 210 in a stacked configuration relative to the microelectronic interposer first surface 122 and the microelectronic interposer second surface 132. In still a further embodiment, the debug access port B may further include a probe contact 216 that may be formed at the microelectronic interposer side 134 and connected to the debug trace 210 (shown in shadow lines). The probe contact 216 may be any known microelectronic interposer structure, such as a blind via, a buried via, or a plated through hole. The probe contact 216 may be larger than the debug trace 210 to enable easier contact with an external debug probe (not shown).

Figure 3:
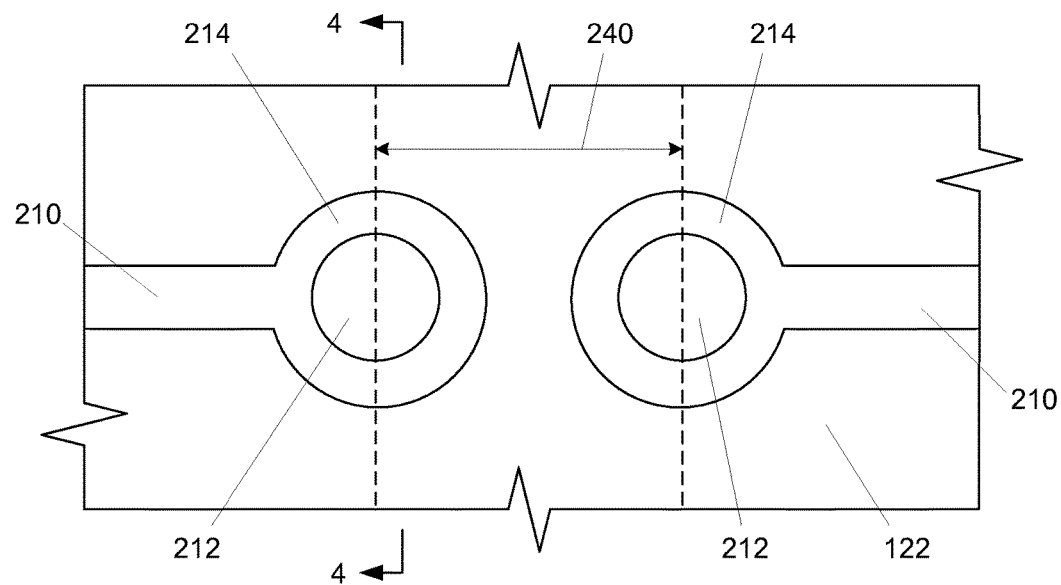
FIG. 3 illustrates a top view of the adjacent microelectronic packages prior to dicing, according to embodiments of the present description.
Figure 4:
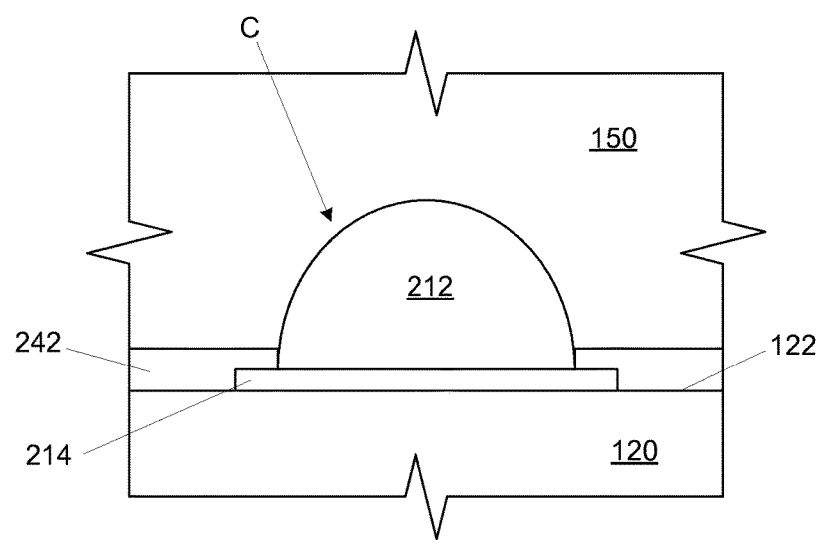
FIG. 4 illustrates a side view along line 4-4 of FIG. 3 after dicing, according to an embodiment of the present description.

In another embodiments shown in FIGS. 2-4, a debug access port C may comprise the debug trace 210 formed in or on the microelectronic interposer first surface 122. The debug trace 210 may simply terminate at the microelectronic interposer side 134, wherein the debug trace 210 may be contacted by an external debug probe (not shown). In another embodiment, a solder ball or bump 212 may be formed on the debug trace 210. As will be understood to those skilled in the art, the microelectronic package 100 may be formed as a plurality packages (not shown) on a large microelectronic interposer (not shown), wherein individual microelectronic packages 100 are singulated from other packages by cutting material (such as with a wafer saw or with laser ablation) between the packages in an area known as a dicing street 240 (see FIG. 3). As shown in FIG. 3, which is a top plan view of the microelectronic package 100 of FIG. 2 (the encapsulation material 150 of FIG. 2 is not shown for clarity), the debug trace 210 may include an enlarged landing portion 214 to which the solder bump 212 is attached. In one embodiment, a portion of the debug trace 210 and the solder bump 212 may be positioned such that half of the solder bump 212 extends into the dicing street 240; thus, a portion of the debug trace 210 is removed and the solder bump 212 is substantially cut in half during package singulation, which will maximize the surface area of the solder bump 212 at the microelectronic package side 160 (see FIG. 2), as shown in FIG. 4, wherein FIG. 4 illustrates the debug access port C along line 4-4 of FIG. 3 after singulation. As shown in FIG. 4, the solder bump 212 may extend into the encapsulation material 150. It is noted that, as shown in FIG. 4, a solder resist material 242 may patterned on the microelectronic interposer first surface 122 and the debug trace landing portion 214 for the formation of the solder bump 212, as will be understood to those skilled in the art.

Figure 5:
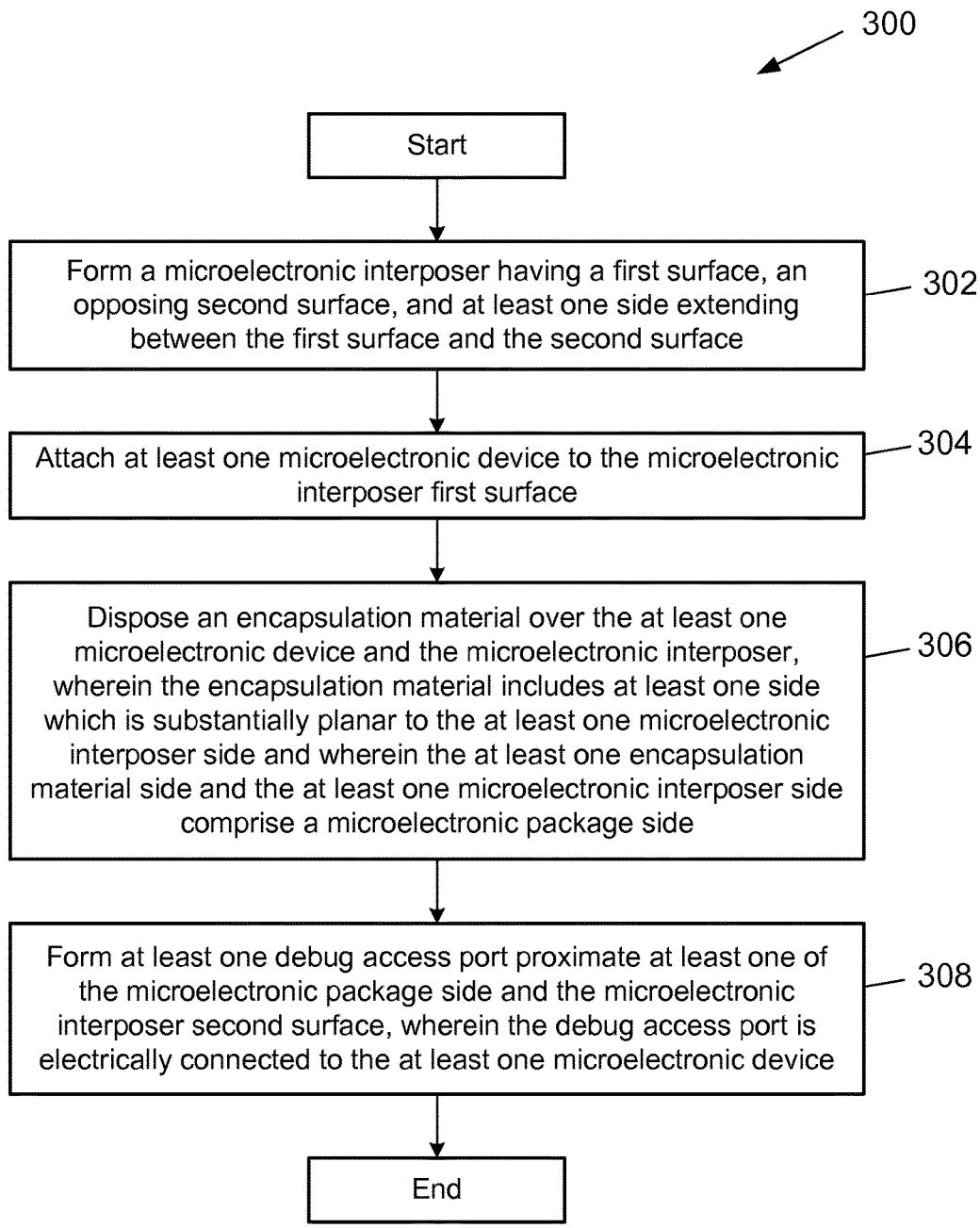
FIG. 5 is a flow chart of a process of fabricating a debug access port of a microelectronic package, according to the present description.

FIG. 5 is a flow chart of a process 300 of fabricating a microelectronic package according to an embodiment of the present description. As set forth in block 302, a microelectronic interposer may be formed having a front surface, an opposing back surface, and at least one side extending between the first surface and the second surface. At least one microelectronic device may be attached to the microelectronic interposer first surface, as set forth in block 304. As set forth in block 306, an encapsulation material may be disposed over the at least one microelectronic device and the microelectronic interposer, wherein the encapsulation material includes at least one side which is substantially planar to at the least one microelectronic interposer side and wherein the at least one encapsulation material side and the at least one microelectronic interposer side comprise a microelectronic package side. At least one debug access port may be formed proximate the least one of the microelectronic package side and the microelectronic interposer second surface, wherein the debug access port is electrically connected to the at least one microelectronic device, as set forth in block 308.

Figure 6:
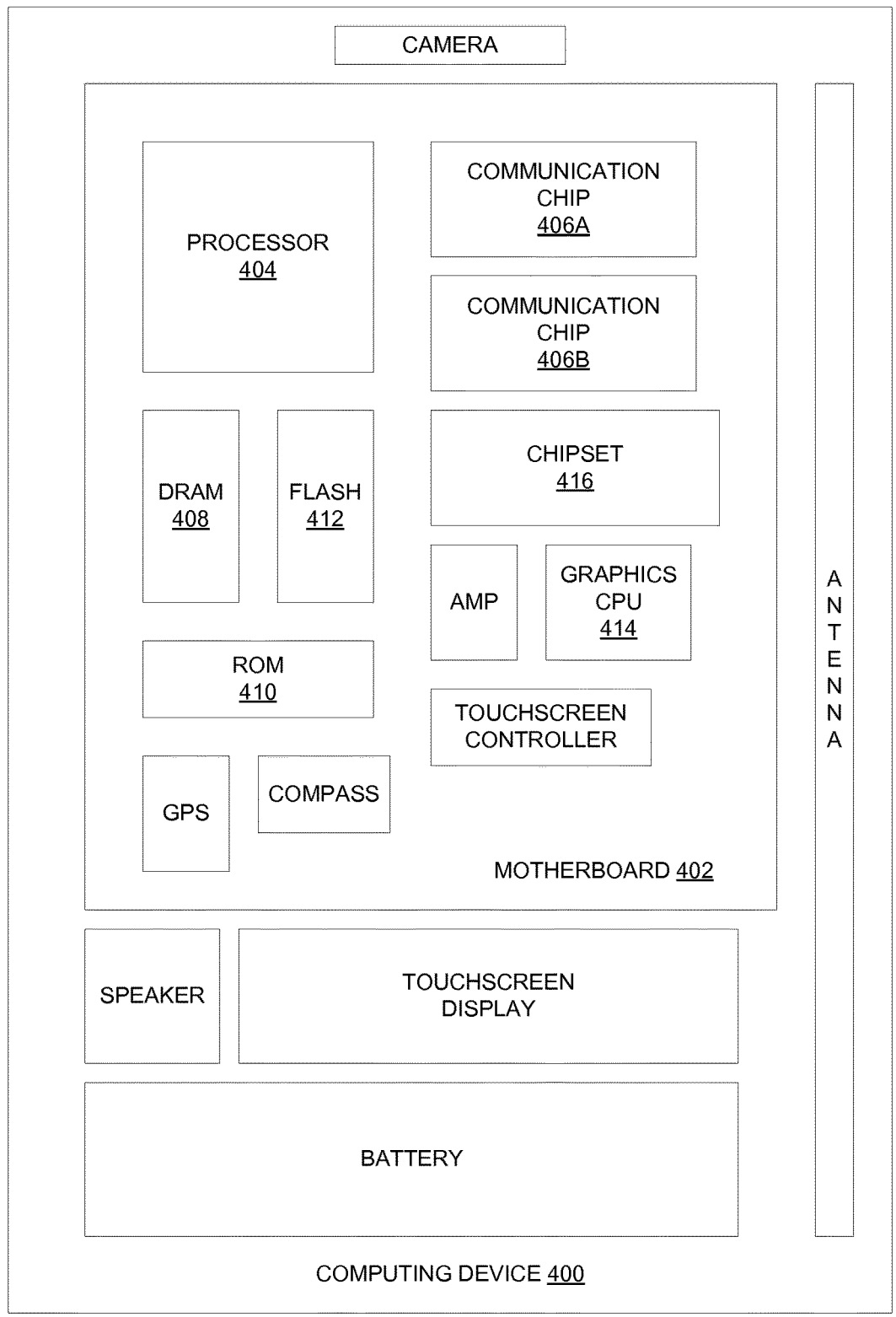
FIG. 6 illustrates a computing device in accordance with one implementation of the present description.

FIG. 6 illustrates an electronic or computing device 400 in accordance with one implementation of the present description. The computing device 400 houses a board 402. The board may include a number of microelectronic components, including but not limited to a processor 404, at least one communication chip 406A, 406B, volatile memory 408 (e.g., DRAM), non-volatile memory 410 (e.g., ROM), flash memory 412, a graphics processor or CPU 414, a digital signal processor (not shown), a crypto processor (not shown), a chipset 416, an antenna, a display, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the microelectronic components may be physically and electrically coupled to the board 402. In some implementations, at least one of the microelectronic components may be a part of the processor 404.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the microelectronic components may comprise a microelectronic device within a microelectronic package, wherein the microelectronic package may comprise a microelectronic interposer having a first surface, an opposing second surface, and at least one side extending between the first surface and the second surface, wherein the microelectronic interposer second surface comprises a microelectronic package attachment surface; at least one microelectronic device attached to the microelectronic interposer first surface; an encapsulation material disposed over the at least one microelectronic device and the microelectronic interposer, wherein the encapsulation material includes at least one side which is substantially planar to the at least one microelectronic interposer side and wherein the at least one encapsulation material side and the at least one microelectronic interposer side comprise a microelectronic package side; and at least one debug access port formed proximate the least one of the microelectronic package side and the microelectronic package attachment surface, wherein the debug access port is electrically connected to the at least one microelectronic device.

In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-6. The subject matter may be applied to other microelectronic devices and assembly applications, as well as any appropriate electronic application, as will be understood to those skilled in the art.

The following examples pertain to further embodiments, wherein Example 1 is a method of fabricating a microelectronic package, comprising a microelectronic interposer having a first surface, an opposing second surface, and at least one side extending between the first surface and the second surface; at least one microelectronic device attached to the microelectronic interposer first surface; an encapsulation material disposed over the at least one microelectronic device and the microelectronic interposer, wherein the encapsulation material includes at least one side which is substantially planar to the at least one microelectronic interposer side and wherein the at least one encapsulation material side and the at least one microelectronic interposer side comprise a microelectronic package side; and at least one debug access port formed proximate the least one of the microelectronic package side and the microelectronic interposer second surface, wherein the debug access port is electrically connected to the at least one microelectronic device.

In Example 2, the subject matter of Example 1 can optionally include the at least one debug access port being formed at the microelectronic interposer first surface.

In Example 3, the subject matter of Example 2 can optionally include the at least one debug access port comprising a debug trace formed on or in the microelectronic interposer first surface and a solder bump formed on the debug trace.

In Example 4, the subject matter of Example 1 can optionally include the at least one debug access port comprising at least one debug trace formed within the microelectronic interposer.

In Example 5, the subject matter of Example 4 can optionally include the at least one debug trace comprising a plurality of debug traces in a stacked configuration relative to the microelectronic interposer first surface and the microelectronic interposer second surface.

In Example 6, the subject matter of Example 4 can optionally include the at least on debug access port comprising at least one probe contact proximate the microelectronic interposer side and electrically connected to the at least one debug trace.

In Example 7, the subject matter of Example 1 can optionally include the at least one debug access port comprising at least one debug trace formed in or on the microelectronic interposer second surface.

In Example 8, the subject matter of Example 7 can optionally include the at least one debug access port further including at least one solder bump formed on the at least one debug trace.

The following examples pertain to further embodiments, wherein Example 9 is a method of fabricating a microelectronic package, comprising forming a microelectronic interposer having a first surface, an opposing second surface, and at least one side extending between the first surface and the second surface; attaching at least one microelectronic device to the microelectronic interposer first surface; disposing an encapsulation material over the at least one microelectronic device and the microelectronic interposer, wherein the encapsulation material includes at least one side which is substantially planar to at the least one microelectronic interposer side and wherein the at least one encapsulation material side and the at least one microelectronic interposer side comprise a microelectronic package side; and forming at least one debug access port proximate the least one of the microelectronic package side and the microelectronic interposer second surface, wherein the debug access port is electrically connected to the at least one microelectronic device.

In Example 10, the subject matter of Example 9 can optionally include forming the at least one debug access port comprising forming the at least one debug access port at the microelectronic interposer first surface.

In Example 11, the subject matter of Example 10 can optionally include forming the at least one debug access port comprising forming a debug trace on or in the microelectronic interposer first surface and forming a solder bump on the debug trace.

In Example 12, the subject matter of Example 11 can optionally include forming the debug trace on or in the microelectronic interposer first surface and forming the solder bump on the debug trace further comprising forming a portion of the debug trace and the solder bump within a dicing street, and forming the microelectronic package side by cutting through the encapsulation material and the microelectronic interposer within the dicing street, which removes portion of the debug trace and the solder bump within the dicing street.

In Example 13, the subject matter of Example 9 can optionally include forming the at least one debug access port comprising forming at least one debug trace within the microelectronic interposer.

In Example 14, the subject matter of Example 13 can optionally include forming the at least one debug trace comprising forming a plurality of debug traces in a stacked configuration relative to the microelectronic interposer first surface and the microelectronic interposer second surface.

In Example 15, the subject matter of Example 13 can optionally include forming the at least on debug access port comprising forming at least one probe contact proximate the microelectronic interposer side and electrically connected to the at least one debug trace.

In Example 16, the subject matter of Example 9 can optionally include forming the at least one debug access port comprising forming at least one debug trace in or on the microelectronic interposer second surface.

In Example 17, the subject matter of one of Examples 16 can optionally include forming the at least one debug access port further including forming at least one solder bump on the at least one debug trace.

The following examples pertain to further embodiments, wherein Example 18 is an electronic system comprising a microelectronic substrate, and a microelectronic package attached to the microelectronic substrate, wherein the microelectronic package comprises a microelectronic interposer having a first surface, an opposing second surface, and at least one side extending between the first surface and the second surface; at least one microelectronic device attached to the microelectronic interposer first surface; an encapsulation material disposed over the at least one microelectronic device and the microelectronic interposer, wherein the encapsulation material includes at least one side which is substantially planar to the at least one microelectronic interposer side and wherein the at least one encapsulation material side and the at least one microelectronic interposer side comprise a microelectronic package side; and at least one debug access port formed proximate the least one of the microelectronic package side and the microelectronic interposer second surface, wherein the debug access port is electrically connected to the at least one microelectronic device.

In Example 19, the subject matter of Example 18 can optionally include the at least one debug access port being formed at the microelectronic interposer first surface.

In Example 20, the subject matter of Example 19 can optionally include the at least one debug access port comprising a debug trace formed on or in the microelectronic interposer first surface and a solder bump formed on the debug trace.

In Example 21, the subject matter of Example 18 can optionally include the at least one debug access port comprising at least one debug trace formed within the microelectronic interposer.

In Example 22, the subject matter of Example 21 can optionally include the at least one debug trace comprising a plurality of debug traces in a stacked configuration relative to the microelectronic interposer first surface and the microelectronic interposer second surface.

In Example 23, the subject matter of Example 21 can optionally include the at least on debug access port comprising at least one probe contact proximate the microelectronic interposer side and electrically connected to the at least one debug trace.

In Example 24, the subject matter of Example 18 can optionally include the at least one debug access port comprising at least one debug trace formed in or on the microelectronic interposer second surface.

In Example 25, the subject matter of Example 24 can optionally include the at least one debug access port further including at least one solder bump formed on the at least one debug trace.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A microelectronic package, comprising:
   a microelectronic interposer having a first surface, an opposing second surface, and at least one side extending between the first surface and the second surface;
   at least one microelectronic device attached to the microelectronic interposer first surface;
   an encapsulation material disposed over the at least one microelectronic device and the microelectronic interposer, wherein the encapsulation material includes at least one side which is substantially planar to the at least one microelectronic interposer side and wherein the at least one encapsulation material side and the at least one microelectronic interposer side comprise a microelectronic package side; and
   at least one exposed debug access port formed proximate the least one of the microelectronic package side and the microelectronic interposer second surface, wherein the exposed debug access port is electrically connected to the at least one microelectronic device.

2. The microelectronic package of claim 1, wherein the at least one exposed debug access port is formed at the microelectronic interposer first surface.

3. The microelectronic package of claim 1, wherein the at least one exposed debug access port comprises at least one exposed debug trace formed within the microelectronic interposer.

4. The microelectronic package of claim 3, wherein the at least one exposed debug trace comprises a plurality of exposed debug traces in a stacked configuration relative to the microelectronic interposer first surface and the microelectronic interposer second surface.

5. The microelectronic package of claim 3, wherein the at least one exposed debug access port comprises at least one probe contact on the microelectronic interposer side and electrically connected to the at least one exposed debug trace.

6. The microelectronic package of claim 1, wherein the at least one exposed debug access port comprises at least one exposed debug trace formed in or on the microelectronic interposer second surface.

7. An electronic system, comprising
   a microelectronic substrate; and
   a microelectronic package attached to the microelectronic substrate, wherein the microelectronic package comprises:
      a microelectronic interposer having a first surface, an opposing second surface, and at least one side extending between the first surface and the second surface;
      at least one microelectronic device attached to the microelectronic interposer first surface;
      an encapsulation material disposed over the at least one microelectronic device and the microelectronic interposer, wherein the encapsulation material includes at least one side which is substantially planar to the at least one microelectronic interposer side and wherein the at least one encapsulation material side and the at least one microelectronic interposer side comprise a microelectronic package side; and
      at least one exposed debug access port formed proximate the least one of the microelectronic package side and the microelectronic interposer second surface, wherein the exposed debug access port is electrically connected to the at least one microelectronic device.

8. The electronic system of claim 7, wherein the at least one exposed debug access port is formed at the microelectronic interposer first surface.

9. The electronic system of claim 7, wherein the at least one exposed debug access port comprises at least one exposed debug trace formed within the microelectronic interposer.

10. The electronic system of claim 9, wherein the at least one exposed debug trace comprises a plurality of exposed debug traces in a stacked configuration relative to the microelectronic interposer first surface and the microelectronic interposer second surface.

11. The electronic system of claim 9, wherein the at least en one exposed debug access port comprises at least one probe contact proximate the microelectronic interposer side and electrically connected to the at least one debug trace.

12. The electronic system of claim 7, wherein the at least one exposed debug access port comprises at least one debug trace formed in or on the microelectronic interposer second surface.

13. The microelectronic package of claim 3, wherein the at least one exposed debug trace extends to and is exposed at the at least one side of the microelectronic interposer.

14. The microelectronic package of claim 6, wherein the at least one exposed debug trace extends to and is exposed at the at least one side of the microelectronic interposer.

15. The electronic system of claim 9, wherein the at least one exposed debug trace extends to and is exposed at the at least one side of the microelectronic interposer.

16. The electronic system of claim 12, wherein the at least one exposed debug trace extends to and is exposed at the at least one side of the microelectronic interposer.

* * * * *